United States Patent [19]

Fang

[11] Patent Number: 5,504,423

[45] Date of Patent: Apr. 2, 1996

[54] METHOD FOR MODELING INTERACTIONS IN MULTILAYERED ELECTRONIC PACKAGING STRUCTURES

[75] Inventor: Jiayuan Fang, Vestal, N.Y.

[73] Assignee: The Research Foundation of State University of New York, Albany, N.Y.

[21] Appl. No.: 333,155

[22] Filed: Nov. 1, 1994

[51] Int. Cl.$^6$ .................................................. G01R 31/02
[52] U.S. Cl. ........................................ 324/158.1; 324/73.1
[58] Field of Search .............................. 324/73.1, 158.1, 324/765, 537, 500, 632, 639, 603; 364/489; 333/238, 246, 248, 33

[56] References Cited

U.S. PATENT DOCUMENTS

| | | | |
|---|---|---|---|
| 4,262,265 | 4/1981 | Nygren et al. | 333/246 |
| 4,383,226 | 5/1983 | Nygren et al. | 333/238 |
| 4,573,255 | 3/1986 | Gordon et al. | 324/765 |
| 4,644,265 | 2/1987 | Davidson et al. | 324/537 |
| 4,896,108 | 1/1990 | Lynch et al. | 324/765 |
| 4,918,377 | 4/1990 | Buehler et al. | 324/158.1 |
| 5,315,239 | 5/1994 | Vitriol | 324/158.1 |

*Primary Examiner*—Vinh P. Nguyen
*Attorney, Agent, or Firm*—Salzman & Levy

[57] ABSTRACT

A method for analyzing interactions between signal traces/vias and ground/power planes in multilayered electronic packaging structures is featured. The structure is provided with at least two, spaced-apart, conductive (generally metallic) planes, a conductive signal trace interposed between and coplanar with the spaced-apart conductive planes, and a via connected to the signal trace. Current that is assumed to be flowing in the via and signal trace is decomposed into two component currents called "modes". The first mode corresponds to a current which induces an electromagnetic field, resulting in an equal potential between the two conductive planes surrounding the signal trace. The second mode is the current which induces an electromagnetic field, resulting in a different voltage potential between the two surrounding conductive planes. The induced voltage in the signal trace/via due to the potential difference between conductive planes, together with the second mode via current that generates radial propagation of the potential difference between conductive planes efficiently and automatically accounts for all interactive effects of interplanar voltages and via/trace currents.

7 Claims, 7 Drawing Sheets

$$k = \frac{Ca}{Cb}$$

1

METHOD FOR MODELING INTERACTIONS IN MULTILAYERED ELECTRONIC PACKAGING STRUCTURES

RELATED APPLICATION

This application is related to co-pending U.S. Pat. application Ser. No. 08/325,006, filed by the present applicant on Oct. 18, 1994, titled METHOD FOR ANALYZING VOLTAGE FLUCTUATIONS IN MULTILAYERED ELECTRONIC PACKAGING STRUCTURES, which is hereby incorporated by reference.

FIELD OF THE INVENTION

This invention pertains to simulating interactions between signal traces and conductive planes in electronic packaging structures and, more particularly, to investigating potential signal degradation caused by voltage fluctuations between conductive planes of multilayered electronic packaging structures.

BACKGROUND OF THE INVENTION

Electronic packaging refers to the physical implementations of electrical circuits of integrated circuit (IC) chips, modules, chip or module carriers, cards, boards or backplanes. Such components and devices are often referred to as electronic packaging structures. The terms "electronic packaging structure" "electronic package" and "package" are hereinafter used interchangeably to refer to any or all of the aforementioned devices and structures. For purposes of this discussion, such structures include multilayered packaging, in which a plurality of substantially parallel conductive planes (designated as ground and/or power or voltage planes) are separated from one another by non-conductive dielectric material. In addition to power and ground planes, signal paths or traces for carrying dynamic information are routed on additional substantially parallel layers interposed between voltage and/or ground planes. These layers of signal traces are also isolated from power/ground planes and from each other by dielectric layers. Via pins are utilized to connect planes and/or traces to other planes and/or traces or to form connections external to the package structure. The power and ground planes, together with the vias connected thereto, provide the power and ground supply system for IC chips, whereas signal traces, together with the vias connected thereto, provide electrical interconnections between chips and circuits both internal and external to the package. Because signal traces are embedded in dielectric media sandwiched between conductive planes, interactions take place between currents carried on signal traces and voltage fluctuations on these conductive planes.

More specifically, currents flowing in signal traces and/or vias may induce voltage fluctuations between adjacent ground and/or power planes. Likewise, voltage fluctuations between adjacent power and/or ground planes may induce spurious currents in signal traces and/or vias. These interactions may be so severe that the integrity of the signal being carried on a particular trace/via may be adversely, perhaps even catastrophically affected.

It has long been the practice of digital electronic system designers to employ simulation techniques to predict the ultimate behavior of those systems before the actual hardware implementation thereof. As large-scale integration (LSI) and very large-scale integration (VLSI) techniques have allowed greater numbers of circuits to be packaged in smaller spaces, it has become increasingly difficult to construct physical prototypes of proposed digital systems prior to the actual construction of the chip. Therefore, although the simulation of proposed systems was once merely advisable, it is now necessary.

Because of ever-increasing IC transition speed, power/ground noise (known as simultaneous switching noise [SSN] or delta-I noise) has posed a significant challenge to reliable, high-speed IC operation. Numerous problems arising therefrom (such as larger delays, the loss of signal integrity and false switching of devices) can lead to the malfunctioning of overall systems.

SSN or delta-I noise is generated when a logic gate changes state, thereby altering the current flow in a system. The resulting change in current (delta-I) induces transient voltage variations in nearby metallic planes and/or conductors. Of particular interest are voltages induced in the voltage supply and/or ground planes that are usually found in multilayered packages. The effects of noise on actual hardware must be accounted for in any system simulation in order for the simulation to predict true hardware system performance.

In the aforementioned co-pending application, Ser. No. 08/325,006, a novel technique for modeling the influence of voltage fluctuations between planes in an electronic packaging structure is taught. That technique, however, does not account for interactions between signal traces and/or signal vias and power and ground planes. Heretofore, accounting for these types of interactions has been beyond the capabilities of any practical simulation tools.

It is an object of the present invention to provide a method for simulating an electronic packaging structure wherein effects of interactions of signal traces and/or vias with planes and vice versa are fully considered.

It is a further object of the invention to present a computationally efficient method for simulating such interactions.

It is yet a further object of the invention to provide a method compatible with existing numerical simulation systems.

SUMMARY OF THE INVENTION

In accordance with the present invention, there is provided a method for analyzing interactions between signal traces/vias and ground/power planes in multilayered electronic packaging structures. A physical electronic packaging structure is provided which has at least two, spaced-apart, conductive (generally metallic) planes, a conductive signal trace interposed between and parallel with the spaced-apart conductive planes, and at least one via connected to the signal trace. The via passes through at least one of the planes. The signal trace between the two surrounding, conductive planes is assumed to be a strip transmission line for purposes of analysis.

A current is assumed to be flowing in the signal via and trace. The current flowing in the via and signal trace is decomposed into two component currents called "modes". The first mode, called the "strip-line mode" corresponds to a current which induces an electromagnetic field, resulting in an equal potential between the two conductive planes surrounding the signal trace. The second mode, called the "parallel-plate mode", is the current which induces an electromagnetic field, resulting in a different voltage potential between the two surrounding conductive planes. The parallel plate mode electromagnetic field radially propagates from the via. The influence of the potential difference between conductive planes on the signal via and trace is represented by a dependent voltage source applied to the strip transmission line.

Signal transmission along signal vias and traces under the influence of the dependent voltage source, resulting from the potential difference between conductive planes, may be analyzed by any conventional method for transmission lines. Electromagnetic fields produced by the parallel-plate mode of via current are analyzed by a separate numerical process, called a "plane solver". Simulations of transient variation of signal transmission along strip lines and wave propagation between conductive planes are carried out simultaneously until a user-specified termination time. The dependent voltage source applied to strip transmission lines, as well as the parallel-plate mode via current that is fed to the plane solver, are updated after each time-step of simulation. This process automatically includes all interactive effects of interplanar voltages and via/trace currents.

BRIEF DESCRIPTION OF THE DRAWINGS

A complete understanding of the present invention may be obtained by reference to the accompanying drawings, when taken in conjunction with the detailed description thereof and in which:

FIG. 2b is a cross-sectional schematic view of the strip transmission line formed by the structure of FIGURE 2a;

FIG. 6 is a plot of a Gaussian current pulse used for numerical simulation of the structure of FIG. 2a;

DESCRIPTION OF THE PREFERRED EMBODIMENT

Figure 1:
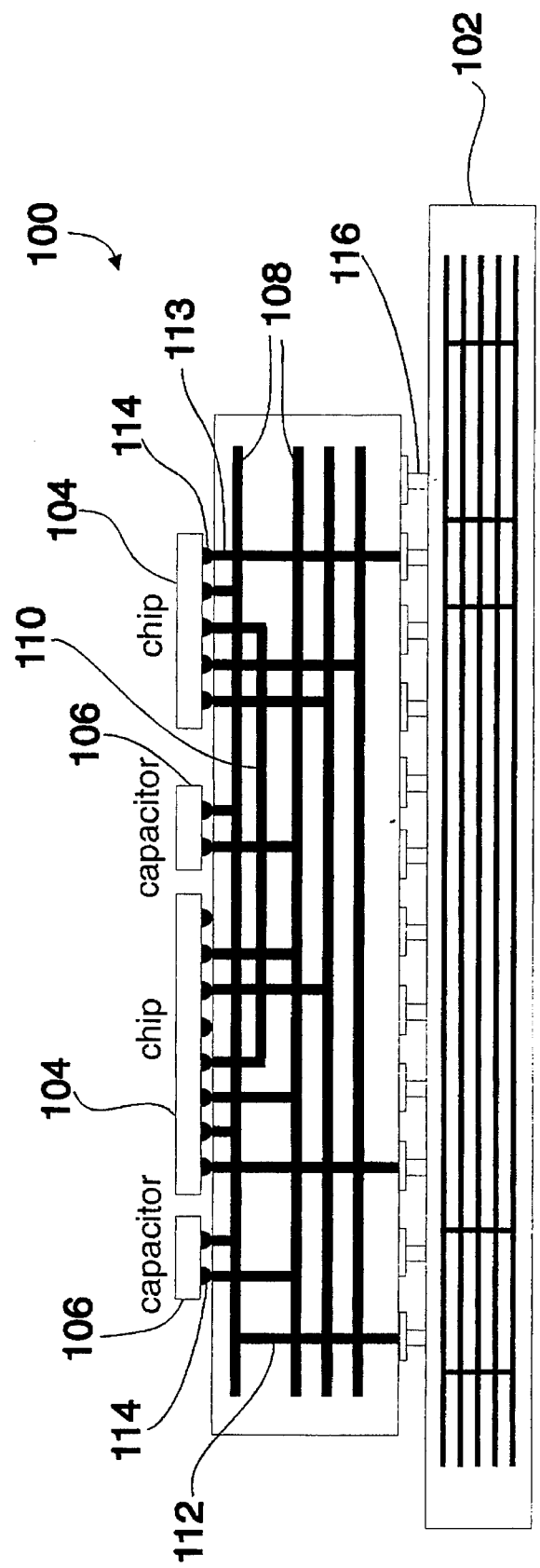
FIG. 1 is a cross-sectional schematic view of a typical electronics packaging structure.

Referring first to FIG. 1 there is shown a cross-sectional diagram of a typical physical electronic packaging structure. A chip carrier, shown generally at reference numeral 100, is mounted on a printed circuit board 102. Chip carrier 100 is typical of the types of electronic packaging structures employed today. Microelectronic chips or modules 104 and discrete capacitors 106 are mounted on the upper surface of chip carrier 100. Power/ground planes 108 sandwich a signal trace 110 which interconnects appropriate pins 114 of modules 104. Vias 112 passing through power/ground planes 108 and/or signal trace layers 110 interconnect planes 108 and/or signal traces 110 and module pins 114. Other vias 112 provide connections 116 to printed circuit board 102.

Figure 2A:
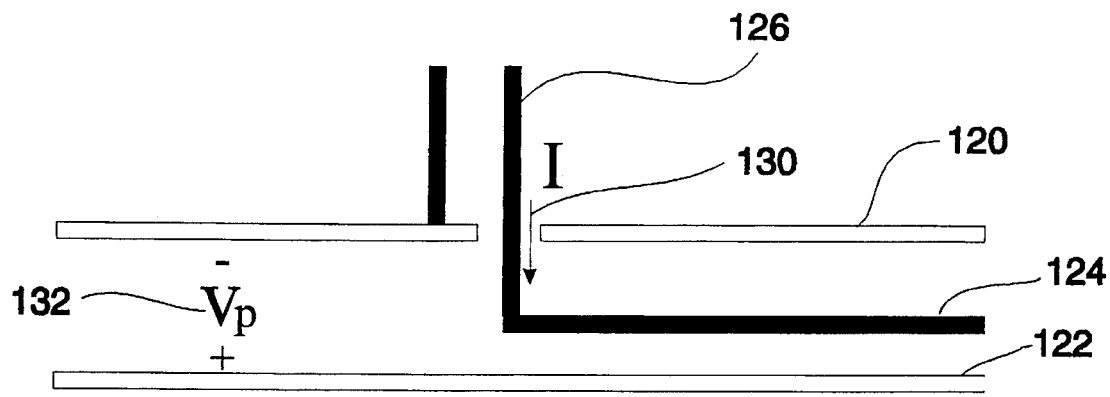
FIG. 2a is a cross-sectional schematic view of a simple electronics packaging structure containing two conductive planes, a signal trace and a via.
Figure 2B:
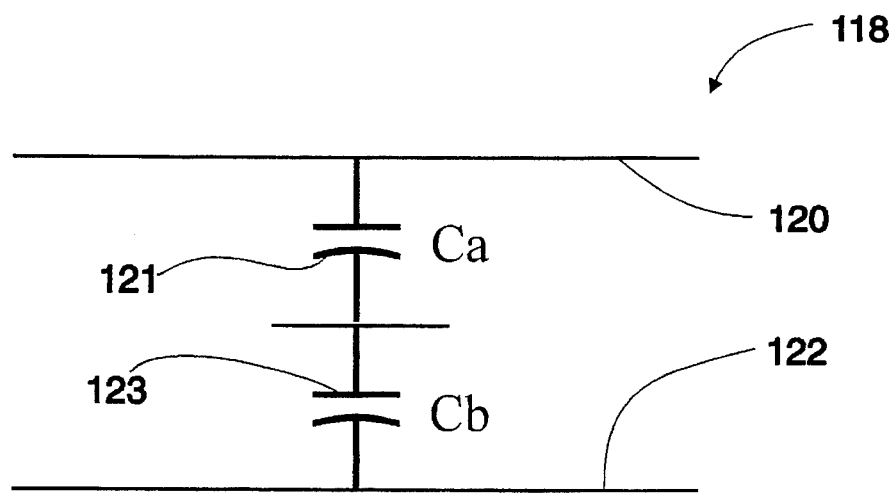

Referring now to FIG. 2a, there is shown a simple package consisting of two planes 120 and 122 and a signal via 126 electrically connected to signal trace 124. Signal trace 124, positioned between planes 120 and 122, forms a classic strip transmission line. A current I 130 flows into via 126 and subsequently through signal trace 124. Referring now to FIG. 2b, there is shown a cross-section view of the strip transmission line. A capacitor $C_a$ 121 represents the capacitance per unit length between trace 124 and conductive plane 120. Another capacitor $C_b$ 123 is the capacitance per unit length between the trace 124 and the conductive plane 122. A constant k is defined, pursuant to Equation (1), as:

$$k = \frac{C_a}{C_b} \quad (1)$$

For given physical dimensions and the location of a strip line, numerical values of $C_a$ 121 and $C_b$ 123 can be found in various electrical engineering handbooks or by using software tools well known in the art.

Figure 2C:
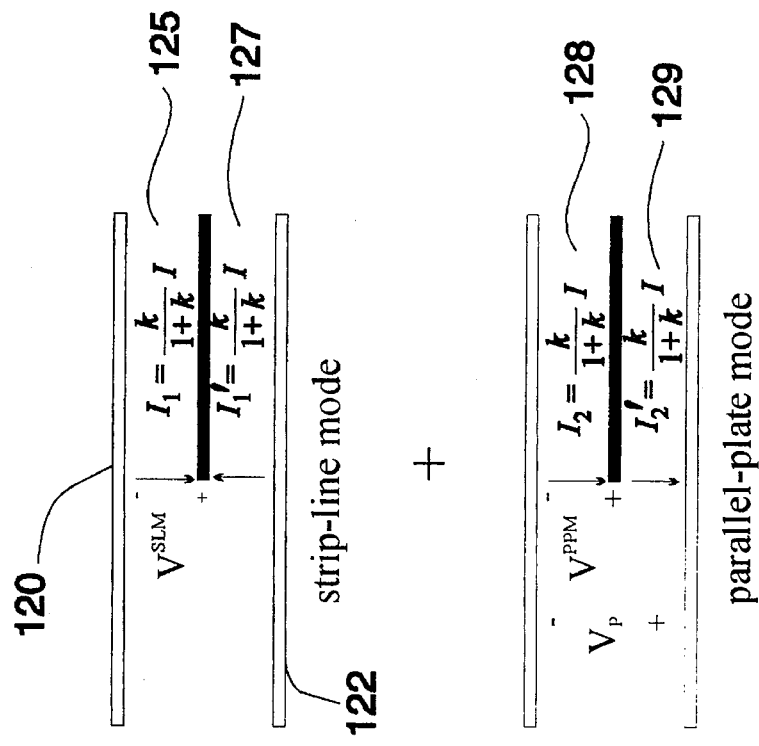
FIG. 2c is a cross-sectional schematic view showing the decomposition of currents into strip line and parallel plate modes.
Figure 2C:
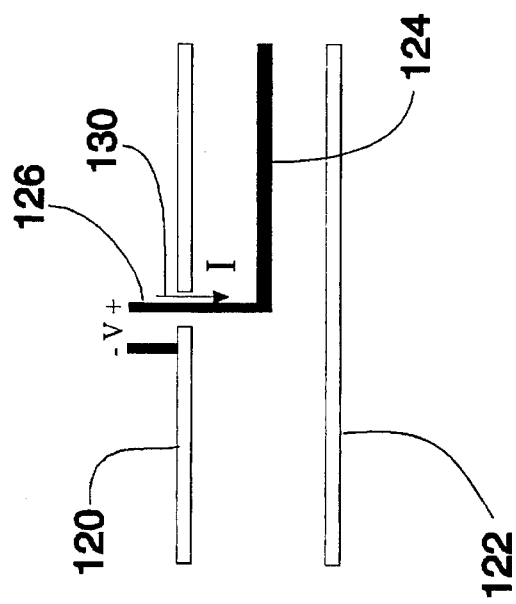

Current 130 flowing in via 126 generates electromagnetic fields (not shown). The present invention is based on the fact that these electromagnetic fields may be decomposed into two components or "modes". Referring now also to FIG. 2c, the two modes are shown schematically. The first mode, called the strip-line mode of electromagnetic fields, is produced by currents $I_1$ 125 and $I_1'$ 127. The summation of the two currents $I_1$ 125 and $I_1'$ 127 should equal the original current I 130 which flows in the via 126 and trace 124. In order to ensure that electromagnetic fields produced by currents $I_1$ 125 and $I_1'$ 127 do not induce a potential difference between planes 120 and 122, values of $I_1$ 125 and $I_1'$ 127 are determined as follows:

$$I_1 = \frac{k}{1+k} I \quad (2)$$

$$I_1' = \frac{1}{1+k} I \quad (3)$$

The constant k in Equations (2) and (3) can be computed by Equation (1), or be approximated by the ratio of the distance from trace 124 to plane 122 over the distance from trace 124 to plane 120. The voltage between signal trace 124 and the upper conductive plane 120 is denoted as $V^{SSM}$. Electromagnetic fields of the strip-line mode propagate along the strip transmission line according to classic transmission line theory.

The second mode, called the parallel-plate mode of electromagnetic fields, is produced by currents $I_2$ 128 and $I_2'$ 129. Currents $I_2$ 128 and $I_2'$ 129 are equal in amplitude and also in direction of flow and their values are expressed as:

$$I_2 = I_2' = \frac{1}{1+k} I \quad (4)$$

Currents $I_2$ 128 and $I_2'$ 129 form a continuous current that flows from plane 120 to plane 122. This current produces electromagnetic fields radially propagating away from the via 126. In the parallel-plate mode of electromagnetic fields, signal trace 124 has virtually no effect on the radially propagated fields; no current flows in signal trace 124. The voltage between signal trace 124 and the upper conductive plane 120 is denoted as $V^{PPM}$, whereas the voltage between two conductive planes 120 and 122 is called $V_p$. The relation between $V^{PPM}$ and $V_p$ is:

$$V^{PPM} = \frac{1}{1+k} V_p \quad (5)$$

The parallel-plate mode of electromagnetic fields, generated by the parallel-plate mode of via current $I_2$ 128, can be computed by various numerical techniques known in the art. Software tools for simulating parallel-plate mode electromagnetic fields, sometimes called "plane solvers", include the finite-difference time-domain (FDTD) method, the finite-element method, the capacitor/inductor mesh model, transmission line mesh model, etc. The impedance transformation technique taught in the aforementioned copending application can be used to enhance the computation accuracy of the above-mentioned numerical methods in simulating the parallel-plate mode of electromagnetic fields.

According to the well-known superposition principle in classical electromagnetic theory, the superposition of the electromagnetic fields associated with the strip-line and the parallel-plate modes should result in the electromagnetic fields in the original structure shown on the left of FIG. 2c. The voltage V between signal via 126 and the upper conductive plane 120 relates to voltages $V^{SLM}$ and $V^{PPM}$ by the equation:

$$V = V^{SLM} + V^{PPM} \quad (6)$$

Figure 3:
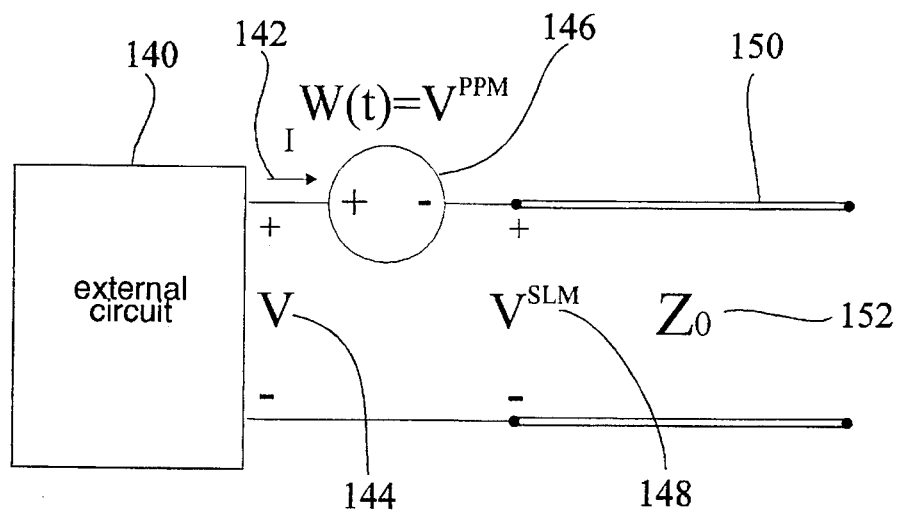
FIG. 3 is a circuit model of the structure of FIG. 2.

Referring now to FIG. 3, an equivalent circuit model of the structure of FIG. 2a is shown. Reference numeral 150 represents the strip transmission line formed by signal trace 124 (FIG. 2a), and planes 120 and 122. $Z_O$ 152 is the characteristic impedance of the strip transmission line 150. A circuit box 140 represents any circuit connected to the pair of vias 126 above conductive plane 120. Dependent voltage source w(t) is the voltage $V^{PPM}$.

It is apparent that Equation (6) is satisfied in the equivalent circuit model in FIG. 3. Simulation of the equivalent circuit model in FIG. 3 can be performed with any conventional circuit and transmission line analysis technique. Since the dependent voltage source w(t), which is the same as $V^{PPM}$, depends on the potential difference $V_p$ between conductive planes 120 and 122 (FIG. 2a) [Equation (5)], the influence of voltage fluctuations on conductive planes 120 and 122 to the strip transmission line 150 is automatically accounted for.

Simulations of the equivalent circuit model shown in FIG. 3 and the parallel-plate mode of electromagnetic fields are performed simultaneously, one time-step after another. The dependent voltage source w(t) applied to the strip transmission line 150 as well as the parallel-plate mode via current $I_2$ 128 (FIG. 2c) applied to the plane solver are updated after each time-step of simulation. This simulation technique efficiently and automatically takes into account the interaction between conductive planes and signal vias/traces.

Figure 4:
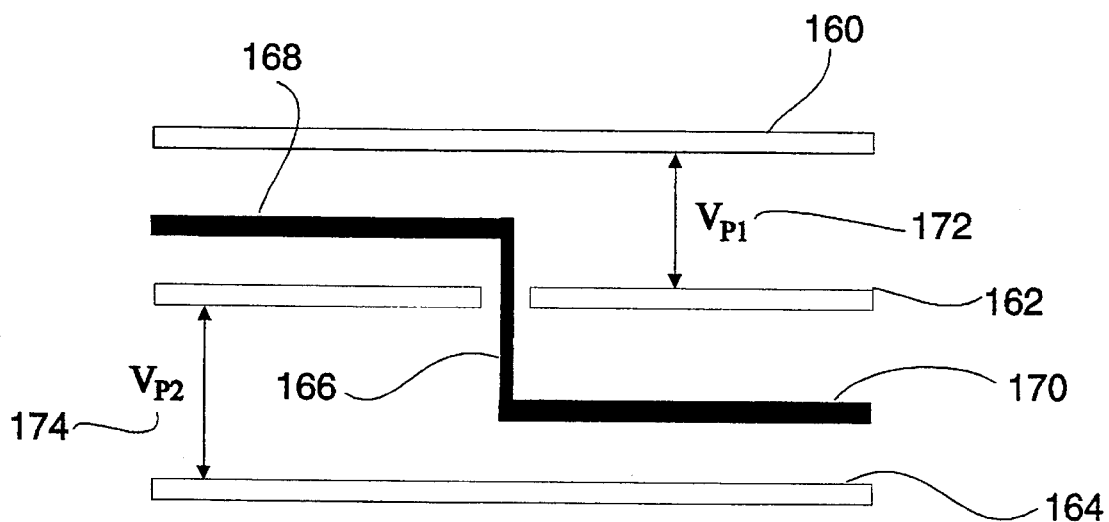
FIG. 4 is a cross-sectional schematic view of a more complex packaging structure consisting of three planes, two signal traces and a via.

The circuit model of the structure shown in FIG. 2a can be extended to other signal via configurations. Referring now to FIG. 4 there is shown a more complex electronics packaging structure than the structure depicted in FIG. 2a. Three conductive planes 160, 162, and 164 are shown. A single via 166 interconnects a signal trace 168, located between planes 160 and 162, and a signal trace 170, located between planes 162 and 164. $V_{p1}$ 172 is the potential difference between planes 160 and 162 and $V_{p2}$ 174 is the potential difference between planes 162 and 164.

Figure 5:
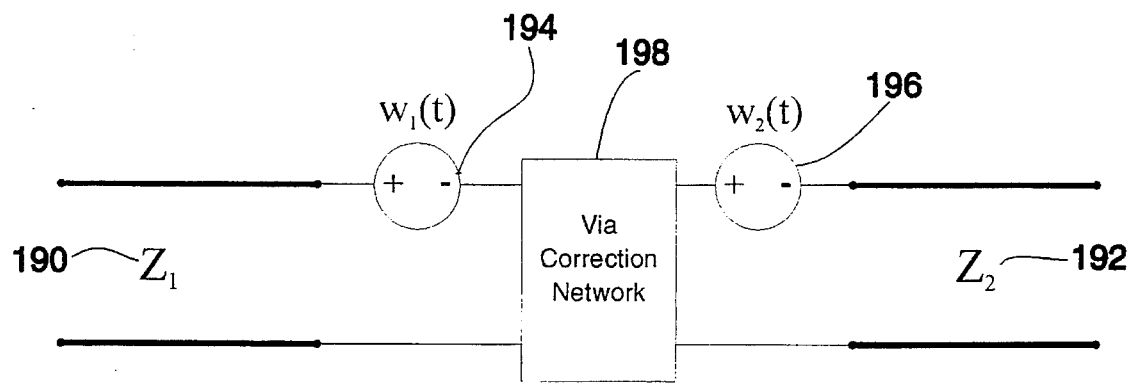
FIG. 5 is a circuit model of the structure of FIG. 4.

Referring now also to FIG. 5, there is shown the circuit model of the structure of FIG. 4. $Z_1$ 190 is the characteristic impedance of the strip transmission line formed by the signal trace 168 and conductive planes 160 and 162. $Z_2$ 192 is the characteristic impedance of the strip transmission line formed by the signal trace 170 and conductive planes 162 and 164. $w_1(t)$ 194 is a voltage source proportional to potential difference $V_{p1}$ 172. $w_2(t)$ 196 is a voltage source proportional to potential difference $V_{p2}$ 174. Again, the proportionality constants are dependent upon the relative distances between the signal traces 168 and 170 and the conductive planes 160, 162 and 164. Via correction network 198 is an equivalent circuit network representing the effects of discontinuities between traces 168 and 170 (FIG. 4) and via 166. The via correction network 198 is described in electrical design handbooks or can be obtained by electromagnetic analysis.

The predicted voltage fluctuations $V_p$ between conductive planes may be verified by numerically simulating a current pulse propagation in the structure of FIG. 2a. A simulation was performed using three-dimensional, finite-difference time-domain (FDTD) simulation techniques well known in the art and discussed in the aforementioned copending application. Simulation using the decomposition method of the present invention was also performed.

Figure 6:
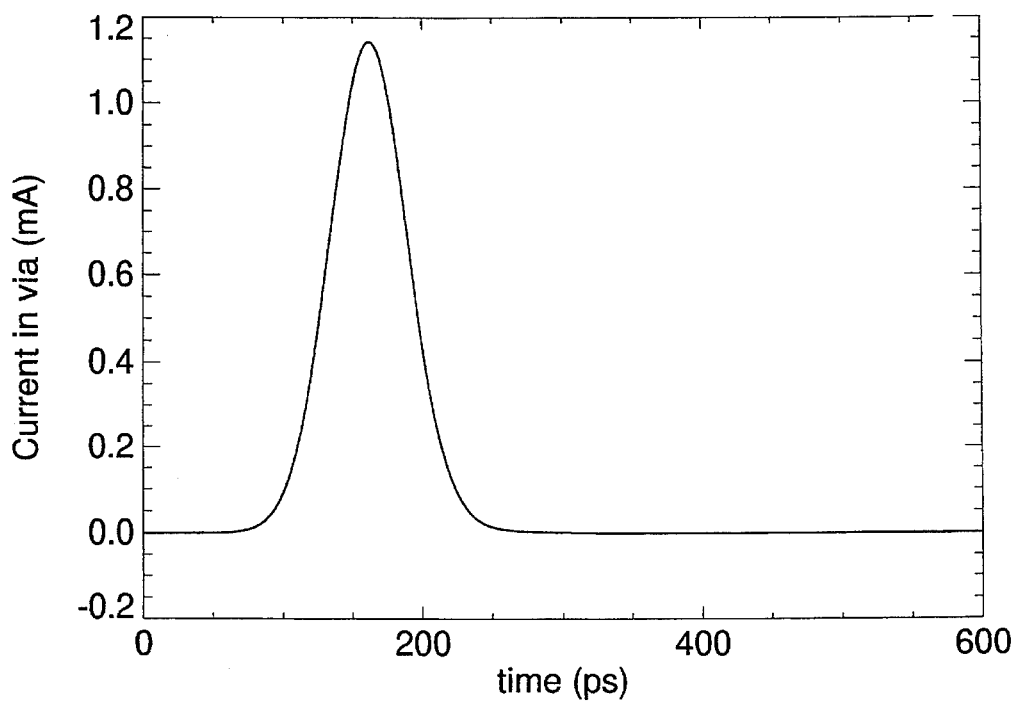

Referring now to FIG. 6, there is shown a plot of a Gaussian current pulse used for the FDTD simulation. The current flows through the via 126 and onto the trace 124. Physical dimensions of the structure shown in FIG. 2a are as follows: the separation between planes 120 and 122 is 200 μm; the signal trace 124 is centered between the surrounding planes 120 and 122 and has a width 100 μm and zero thickness. The signal via 126 has a square crosssection of 100 μm by 100 μm, which corresponds to an equivalent radius of about 56 μm. The length of the mesh-element of the finite-difference mesh of the FDTD method is chosen as 50 μm.

Figure 7A:
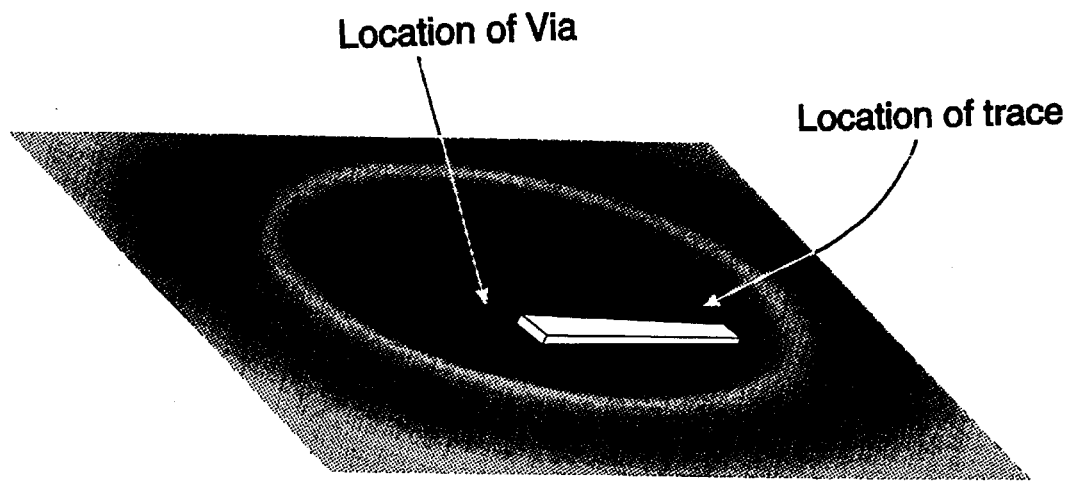
FIG. 7a is a pictorial representation of the distribution of the potential difference between two planes in a vicinity of a via.

For the current flowing through the via 126 (shown in FIG. 6), according to the current decomposition procedure discussed above, part of the current generates electromagnetic fields (parallel-plate mode) which induce a potential difference between planes 120 and 122, and propagate radially away from the via 126. FIG. 7a shows the distribution of the potential difference between planes 120 and 122 at one instant of time, computed by the finite-difference time-domain method. It is apparent from FIG. 7a that the voltage fluctuation between planes 120 and 122 does not propagate along the signal trace 124. Instead, it spreads away from the via in the radial direction.

For the given current flowing through the via 126 (FIG. 6), the part of the current that generates the radially propagating voltage fluctuation between planes 120 and 122 can be calculated using the aforementioned method. Therefore, the amplitude as well as waveform of the voltage fluctuation at any location between planes 120 and 122 can be predicted by radial transmission line theory.

Figure 7B:
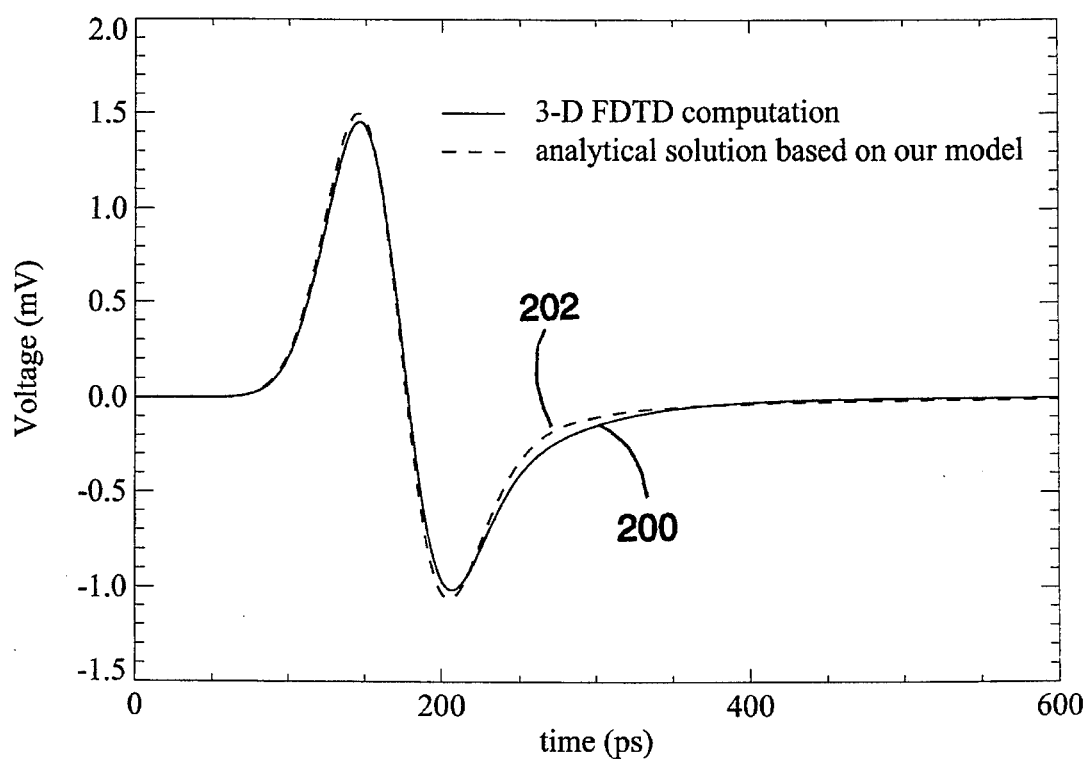
FIG. 7b is the resulting interplanar voltages as calculated using three-dimensional, finite-difference time domain simulation and the current decomposition method of the present invention.

Referring now to FIG. 7b, there are shown plots of the voltage between conductive planes located 500 mm away from signal via 126 (FIG. 2a). A first curve 200 shows the result using a classic 3-D FDTD simulation technique. A second curve 202 shows the same voltage as predicted by the decomposition method of the present invention. Negligible differences are apparent between the two traces.

Figure 8:
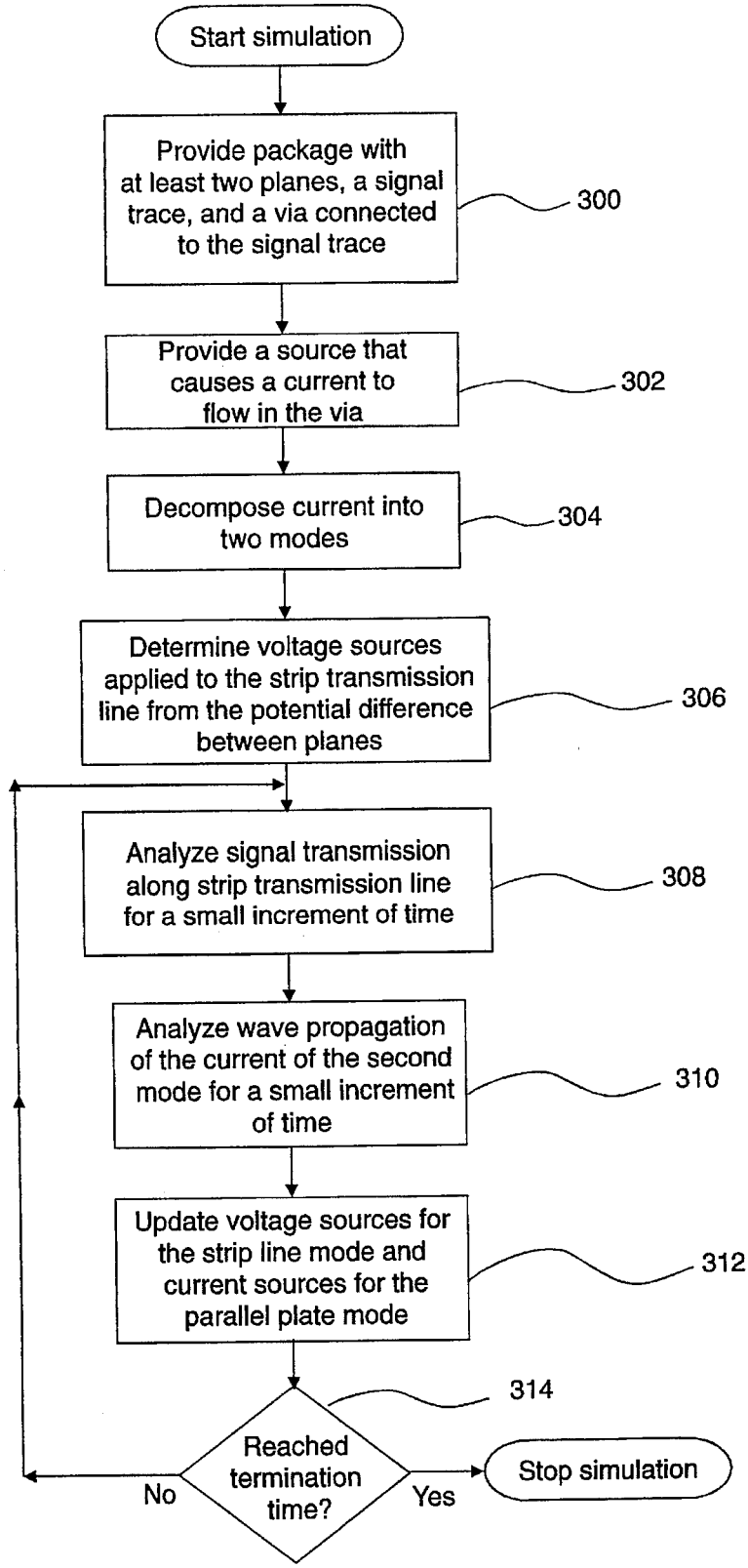
FIG. 8 is a flow chart of the inventive simulation process.

Referring now to FIG. 8, there is shown a flow chart of the inventive process. First, an electronics packaging structure having at least two conductive planes, a signal trace interposed between the conductive planes and a via connected to the signal trace is provided, step 300. A current is caused to flow in the via, step 302. The current is then decomposed into at least two components or modes, step 304. The first mode induces voltages of equal potential in the two conductive planes, and the second mode induces voltage of unequal potential in the conductive planes. Next, the dependent voltage sources applied to the strip transmission lines are determined from the potential difference between conductive planes, step 306. The wave propagation of the first mode of electromagnetic fields is computed by a transmission line simulation technique for a small length of time, step 308. The wave propagation of the electromagnetic fields induced by the second mode current is analyzed for a small length of time, using a plane solver, step 310.

The dependent voltage sources applied to strip transmission lines and second mode currents applied to the plane solver are updated, step 312. Then the process checks whether the simulation time exceeds the user-specified termination time, step 314 If the answer is "No" the process resumes at step 308 for the next time-step of simulation; otherwise, the process terminates.

The aforementioned simulation process automatically and efficiently accounts for all of the complicated plane-to-trace and trace-to-plane interactions in multilayered electronic packaging.

Since other modifications and changes varied to fit particular operating requirements and environments will be apparent to those skilled in the art, the invention is not considered limited to the examples chosen for purposes of disclosure, and covers all changes and modifications which do not constitute departure from the true spirit and scope of this invention.

Having thus described the invention, what is desired to be protected by Letters Patent is presented in the subsequent appended claims.

What is claimed is:

1. A method of analyzing signal integrity in a multilayered physical electronics packaging structure comprising:
   a) providing a package having at least two spaced-apart conductive planes, at least one interposed conductive trace, at least one via connected to said at least one conductive trace and passing through at least one of said conductive planes, said via having a current flowing therethrough, said current inducing a potential difference between said at least two conductive planes;
   b) decomposing said current in said via and said conductive trace into at least a first mode and a second mode, said first mode corresponding to a current that induces a first electromagnetic field which induces a substantially equal potential between conductive planes surrounding said interposed conductive trace, and said second mode corresponding to a current which induces a second electromagnetic field that results in a different voltage potential between said conductive planes surrounding said interposed conductive trace, said first electromagnetic field induced by said first mode current propagating along said conductive trace, and said second electromagnetic field induced by said second mode current propagating radially between said conductive planes, away from said via;
   c) determining the value of a voltage source from said potential difference between said conductive planes at the location at said via;
   d) analyzing the propagation of said first electromagnetic field of said first mode along said conductive trace under the influence of said voltage source;
   e) analyzing the propagation of said second electromagnetic field of said second mode between said conductive planes; and
   f) repeating operations described in (b), (c), (d) and (e) sequentially so that all interactions between said conductive planes and said via-and-conductive-trace in combination can be accounted for automatically when analyzing signal integrity of said electronics packaging structure.

2. The method of analyzing signal integrity in a multilayered physical electronics packaging structure as recited in claim 1 wherein said first electromagnetic field is an electromagnetic field propagated along said conductive trace.

3. The method of analyzing signal integrity in a multilayered physical electronics packaging structure as recited in claim 2 wherein said first mode current is represented by the equations:

$$I_1 = \frac{k}{1+k} I$$

and:

$$I_1' = \frac{1}{1+k} I$$

where k is a constant related to the physical electronics packaging structure.

4. The method of analyzing signal integrity in a multilayered physical electronics packaging structure as recited in claim 3 wherein said constant k comprises the ratio of either the capacitances or the distances between (i) said at least one conductive trace and a first of said at least two conductive planes, and (ii) said at least one conductive trace and a second of at least two conductive planes.

5. The method of analyzing signal integrity in a multilayered physical electronics packaging structure as recited in claim 1 wherein said second electromagnetic field is an electromagnetic field propagated radially from said via.

6. The method of analyzing signal integrity in a multilayered physical electronics packaging structure as recited in claim 5 wherein said second mode current is represented by the equations:

$$I_2 = \frac{1}{1+k} I$$

and:

$$I_2' = \frac{1}{1+k} I$$

where k is a constant related to the physical electronics packaging structure.

7. The method of analyzing signal integrity in a multilayered physical electronics packaging structure as recited in claim 6 wherein said constant k comprises the ratio of either the capacitances or the distances between (i) said at least one conductive trace and a first of said at least two conductive planes, and (ii) said at least one conductive trace and a second of at least two conductive planes.

\* \* \* \* \*